(12) United States Patent
Chen et al.

(10) Patent No.: US 8,692,332 B2
(45) Date of Patent: Apr. 8, 2014

(54) STRAINED-SILICON TRANSISTOR AND METHOD OF MAKING THE SAME

(75) Inventors: Jei-Ming Chen, Tainan (TW);
Hsiu-Lien Liao, Tai-Chung (TW);
Yu-Tuan Tsai, Tainan County (TW);
Teng-Chun Tsai, Tainan (TW)

(73) Assignee: United Microelectronics Corp., Science Based Industrial Park, Hsin-Chu (TW)

( * ) Notice: Subject to any disclaimer, the term of this patent is extended or adjusted under 35 U.S.C. 154(b) by 353 days.

(21) Appl. No.: 12/687,133

(22) Filed: Jan. 14, 2010

(65) Prior Publication Data

US 2011/0169095 A1 Jul. 14, 2011

(51) Int. Cl.
*H01L 21/70* (2006.01)

(52) U.S. Cl.
USPC .......... 257/369; 257/E27.062; 257/288; 257/19

(58) Field of Classification Search
USPC .......... 257/369, E27.062, 374, 288, 19
See application file for complete search history.

(56) References Cited

U.S. PATENT DOCUMENTS

| 5,627,403 | A | 5/1997 | Bacchetta |
| 2008/0096343 | A1 | 4/2008 | Chou |
| 2009/0020791 | A1 | 1/2009 | Yu |

*Primary Examiner* — Elias M Ullah
(74) *Attorney, Agent, or Firm* — Winston Hsu; Scott Margo

(57) ABSTRACT

A structure of a strained-silicon transistor includes a PMOS disposed on a substrate, a silicon nitride layer positioned on the PMOS, and a compressive stress film disposed on the silicon nitride layer, wherein the silicon nitride has a stress between −0.1 Gpa and −3.2 Gpa, and the stress of the silicon nitride is smaller than the stress of the compressive stress layer.

7 Claims, 3 Drawing Sheets

STRAINED-SILICON TRANSISTOR AND METHOD OF MAKING THE SAME

BACKGROUND OF THE INVENTION

1. Field of the Invention

The present invention relates to a semiconductive device and method of making the same, and more particularly to a structure of a strained-silicon transistor and a method of making the same.

2. Description of the Prior Art

With the trend of miniaturization of semiconductor device dimensions, the scale of the gate, source and drain of a transistor is decreased in accordance with the decrease in critical dimension (CD). Due to the physical limitations of the materials used, the decrease in scale of the gate, source and drain results in the decrease of carriers that determine the magnitude of the current in the transistor element, and this can therefore adversely affect the performance of the transistor. Increasing carrier mobility in order to boost up a metal oxide semiconductor (MOS) transistor is therefore an important topic in the field of current semiconductor techniques.

In various current techniques, mechanical stress is generated on purpose in the channel to increase carrier mobility. For example, a compressive or tensile strained channel can be formed by forming stressors on the transistor to improve the carrier mobility. Generally, a tensile stress film is formed on the N type metal oxide semiconductor (NMOS) transistor, and a compressive stress film is formed on the P type metal oxide semiconductor (PMOS) transistor. However, the compressive stress film may separate from the surface of the PMOS, resulting in delamination because of the high compressive stress. Defects will therefore be formed on the PMOS.

SUMMARY OF THE INVENTION

In light of the above, a method of fabricating a strained silicon transistor is proposed in order to solve the problems encountered in the above-mentioned conventional techniques and for further enhancing the operational performance of the MOS transistors.

The present invention provides a method of fabricating a strained silicon transistor. First, a substrate comprising a first transistor and a second transistor is provided. Then, a first stress film is formed on the first transistor. A buffering stress film is then formed on the first stress film and the second transistor, the method of forming the buffering stress film comprises inputting silane and ammonia into a first chamber, the flow rate ratio of silane to ammonia is 2:5. Later, a second stress film is formed on the buffering stress film, wherein the method of forming the second stress film comprises inputting silane, ammonia and hydrogen into a second chamber and the flow rate ratio of silane to ammonia is 1:2. Finally, the buffering stress film and the second stress film on the first stress film are removed simultaneously.

The present invention also provides a structure of a strained-silicon transistor, comprising: a PMOS positioned on a substrate, a buffering stress film positioned on the PMOS, wherein the stress of the buffering stress film is between −0.1 Gpa to −3.2 Gpa and a compressive stress film positioned on the buffering stress film. The compressive stress film includes silicon nitride, and has higher a compressive stress than the buffering stress film.

The feature of the present invention is that two material layers with compressive stress are disposed on the PMOS. The material layer closer to the PMOS is thinner and has lower compressive stress. The material layer further from the PMOS is thicker and has higher compressive stress. In this way, the material layer with lower compressive stress functions as a buffering layer to prevent the material layer with higher compressive stress from separating from the PMOS.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
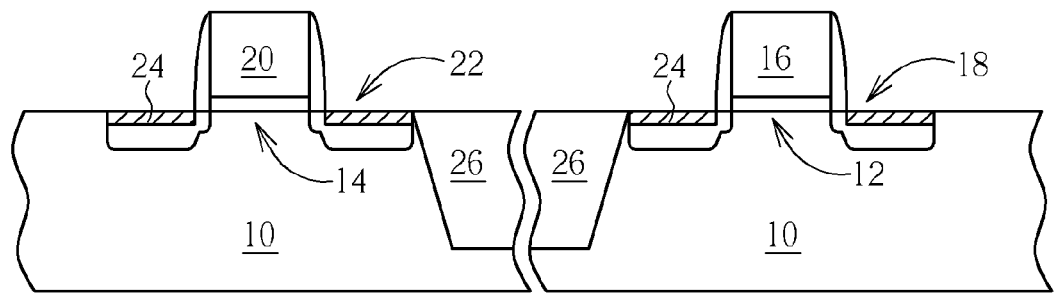
FIGS. 1 to 6 depict a sectional view of a method of fabricating a strained-silicon transistor schematically.

FIGS. 1 to 6 depict a sectional view of a method of fabricating a strained-silicon transistor schematically. As shown in FIG. 1, a substrate 10 such as a wafer or a silicon on insulator wafer is provided. The substrate 10 includes an NMOS 12 and a PMOS 14. The NMOS 12 includes a gate structure 16 and a source/drain doping region 18. The PMOS 14 also includes a gate structure 20 and a source/drain doping region 22. A silicide layer 24 can be optionally formed on the surface of the source/drain doping region 18, 22 to improve the conductivity of the source/drain doping region 18, 22. A shallow trench isolation (STI) structure 26 is optionally disposed in the substrate 10 between the NMOS 12 and the PMOS 14.

Figure 2:
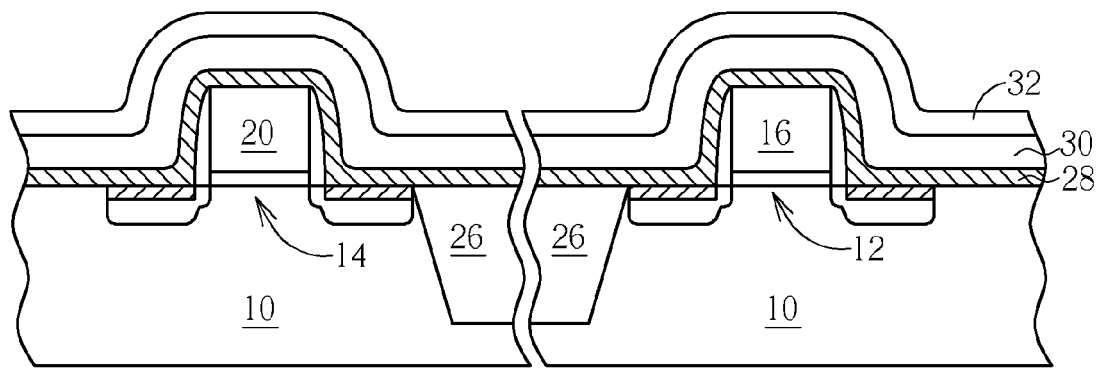

As shown in FIG. 2, a protective layer 28, a tensile stress film 30 and a protective layer 32 are formed on the substrate 10 subsequently, and cover the PMOS 14 and NMOS 12 conformally. The protective layer 28 continuously covers the entire PMOS 14 and continuously covers the entire NMOS 12. The protective layers 28, 32 can be formed optionally. The tensile stress film 30 is preferably silicon nitride formed by plasma enhanced chemical vapor deposition (PECVD). The protective layers 28, 32 are preferably silicon oxide.

Figure 3:
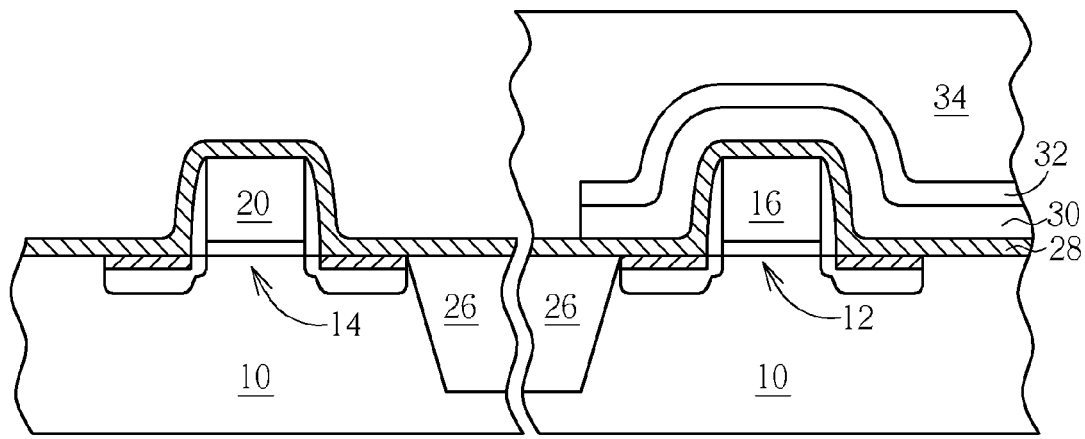

Later, as shown in FIG. 3, a patterned photoresist layer 34 is formed on the NMOS 12 and the protective layer 32, the tensile stress film 30 and the protective layer 28 on the NMOS 12. The protective layer 32 on the PMOS 14 is thereby exposed. After that, the protective layer 32 and the tensile stress film 30 on the PMOS 14 are removed by taking the protective layer 28 as an etching stop layer.

Figure 4:
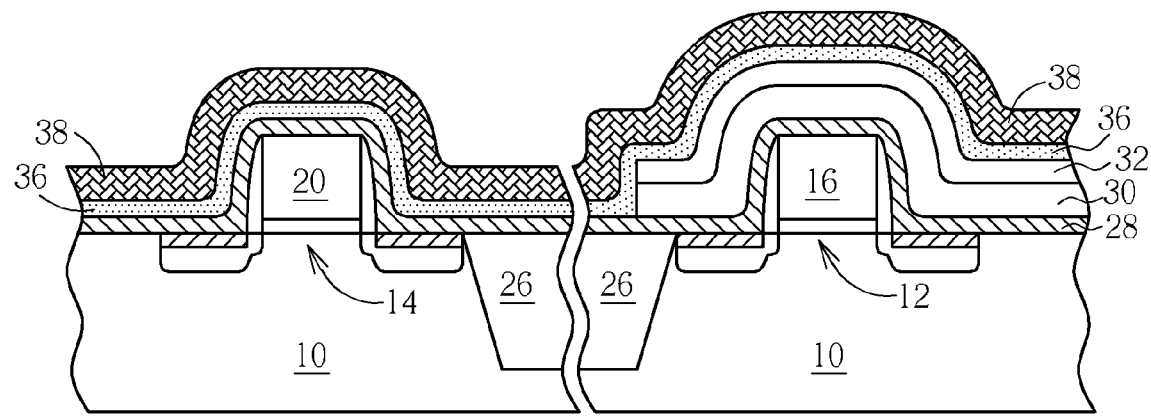

As shown in FIG. 4, the patterned photoresist layer 34 is removed. Then, a PECVD is performed to form simultaneously a buffering stress film such as a silicon nitride layer 36 on the protective layer 28 on the PMOS 14 and on the protective layer 32 on the NMOS 12. The silicon nitride layer 36 is formed by placing the substrate 10 having the PMOS 14, NMOS 12 and above-mentioned material layers into a reaction chamber. Then, silane with flow rate of 54~66 sccm, ammonia with flow rate of 135~165 sccm, nitrogen with flow rate of 1800~2200 sccm and argon with flow rate of 1800~2200 sccm are injected into the reaction chamber to form the silicon nitride layer 36. The pressure of the reaction chamber is 1.8~2.2 torr, and the temperature of the reaction chamber is 360~440° C. The reacting time of PECVD is shorter than 10 seconds. The power of the high frequency radio frequency of the PECVD is 90~110 W, and the power of the low frequency radio frequency of the PECVD is 68~82 W.

According to a preferred embodiment of the present invention, the flow rate of silane is preferably 60 sccm, the flow rate of ammonia is preferably 150 sccm, the flow rate of nitrogen is preferably 2000 sccm and the flow rate of argon is preferably 2000 sccm. The pressure of the reaction chamber is preferably 2 torr, and the temperature of the reaction chamber is preferably 400° C. The power of the high frequency radio frequency of the PECVD is preferably 100 W, and the power of the low frequency radio frequency of the PECVD is preferably 75 W. It is noteworthy that the silicon nitride layer 36 has a compressive stress, and the stress is between −0.1 Gpa to −3.2 Gpa: preferably between −2.0 Gpa to −3.0 Gpa. The thickness of the silicon nitride layer 36 is between 1 angstrom to hundreds of angstroms: preferably between 20 angstrom to 50 angstroms.

After the silicon nitride layer 36 is formed, a main compressive stress film 38 is formed to cover the silicon nitride layer 36 entirely. The main compressive stress film is formed by placing the substrate 10 having the PMOS 14, NMOS 12 and above-mentioned material layers into the aforesaid reaction chamber. Then, silane with flow rate of 45~55 sccm, ammonia with flow rate of 90~110 sccm, hydrogen with flow rate of 3600~4400 sccm and argon with flow rate of 2700~3300 sccm are injected into the reaction chamber to form the main compressive stress film 38. The pressure of the reaction chamber is 1.8~2.2 torr, and the temperature of the reaction chamber is 360~440° C. The reacting time of PECVD is shorter than 185 seconds. The power of the high frequency radio frequency of the PECVD is 108~132 W.

According to a preferred embodiment of the present invention, the flow rate of silane is preferably 50 sccm, the flow rate of ammonia is preferably 100 sccm, the flow rate of hydrogen is preferably 4000 sccm and the flow rate of argon is preferably 3000 sccm. The pressure of the reaction chamber is preferably 2 torr, and the temperature of the reaction chamber is preferably 400° C. The power of the high frequency radio frequency of the PECVD is preferably 120 W.

It is noteworthy that during the formation of the silicon nitride layer 36 is formed, the flow rate ratio of silane to ammonia is 2:5; during the formation of the main compressive stress film 38 the flow rate ratio of silane to ammonia is 1:2. Furthermore, hydrogen is not used when forming the silicon nitride layer 36, and nitrogen is not used when forming the main compressive stress film 38. Moreover, the low frequency radio frequency of the PECVD is not turned on when forming the main compressive stress film 38. In addition, the main compressive stress film 38 can be a multiple layer structure. For example, the main compressive stress film 38 can be a plurality of silicon nitride layers. Between the formations of each silicon nitride layer of the main compressive stress film 38, a UV curing process or an annealing process is performed to adjust the stress of each silicon nitride layer of the main compressive stress film 38. Alternatively, the UV curing process or the annealing process can be performed after all silicon nitride layers of the main compressive stress film 38 are formed. The main compressive stress film 38 is for providing stress to the PMOS 14 so as to form a compressive strain in the channel of the PMOS 14. Preferably, the main compressive stress film 38 is formed immediately after the formation of the silicon nitride layer 36. However, based on different process flows, the silicon nitride layer 36 and the main compressive stress film 38 can be formed in situ or ex-situ.

Figure 5:
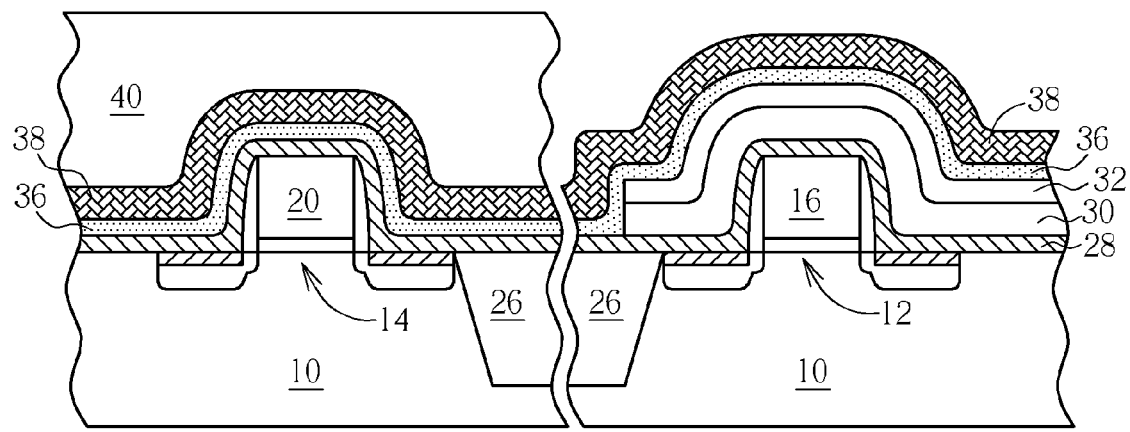

As shown in FIG. 5, a patterned photoresist layer 40 is formed on the substrate 10 to cover the PMOS 14 and expose the main compressive stress film 38 on the NMOS 12. Then, the main compressive stress film 38 and the silicon nitride layer 36 on the NMOS 12 are removed by taking the protective layer 32 as an etching stop layer. Finally, as shown in FIG. 6, the patterned photoresist layer 40 is removed, and the strained-silicon transistor 100 of the present invention is formed.

Figure 6:
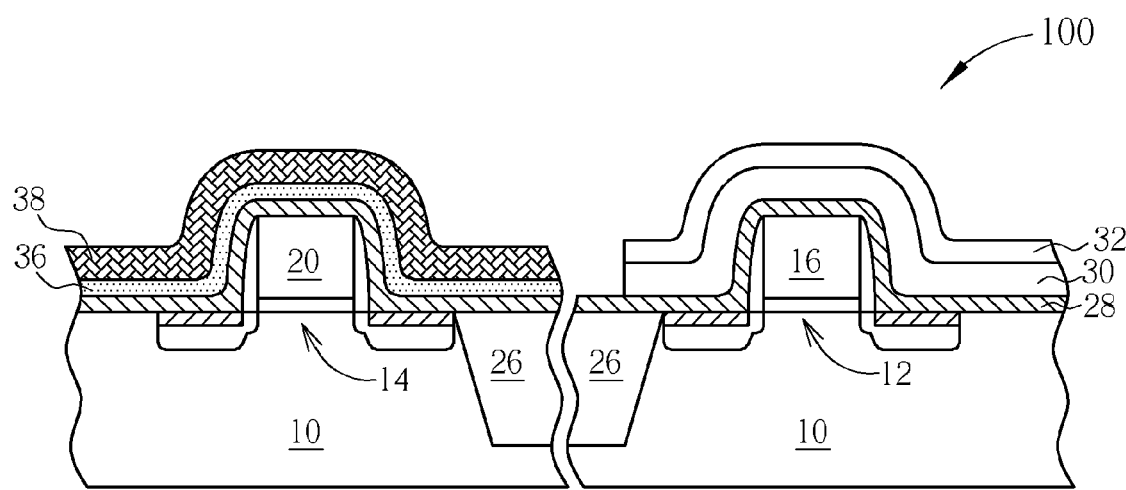

As shown in FIG. 6, the strained-silicon transistor 100 of the present invention includes a PMOS 14 disposed on a substrate 10, a protective layer 28 covering the PMOS 14, a buffering stress film such as silicon nitride layer 36 covering the protective layer 28 and a main compressive stress layer 38 disposed on the silicon nitride layer 36, wherein the stress of the silicon nitride layer 36 is between −0.1 Gpa to −3.2 Gpa: preferably between −2.0 Gpa to −3.0 Gpa. The protective layers 28, 32 can be formed optionally. The thickness of the silicon nitride layer 36 is between 1 angstrom to 200 angstroms: preferably between 20 angstrom to 50 angstroms.

In addition, the main compressive stress film 38 can be a multiple layer structure. For example, the main compressive stress film 38 can be a plurality of silicon nitride layers. Between the formation of each silicon nitride layers of the main compressive stress film 38, a UV curing process or an annealing process is performed to adjust the stress of each silicon nitride layers of the main compressive stress film 38. Alternatively, the UV curing process or the annealing process can be performed after all silicon nitride layers of the main compressive stress film 38 are formed. The main compressive stress film 38 is for providing stress to the PMOS 14 so as to form a compressive strain in the channel of the PMOS 14.

Besides the PMOS 14, the strained-silicon transistor 100 can further comprise an NMOS 12 disposed on the substrate 10. The protective layer 28 also covers the NMOS 12. Additionally, a tensile stress film 30 is disposed on the protective layer 28, and a protective layer 32 covers the tensile stress film 30.

The feature of the present invention is that a buffering stress film (the silicon nitride layer) and a main compressive stress film are positioned on the PMOS. The main compressive stress film is on the buffering stress film. The thickness of the buffering stress film is smaller than the main compressive stress film and the stress of the buffering stress film is lower than the main compressive stress film. In the conventional structure, the main compressive stress film contacts the protective layer directly, causing delamination between the main compressive stress film and the protective layer on the PMOS or the separation between the protective layer and the substrate on the PMOS. However, the buffering stress film in the present invention can prevent the main compressive stress film from contacting the protective layer directly, and can provide buffering stress between the main compressive stress film and the protective layer. In this way, the delamination can be prevented.

Those skilled in the art will readily observe that numerous modifications and alterations of the device and method may be made while retaining the teachings of the invention.

What is claimed is:
1. A strained-silicon transistor structure, comprising:
 a PMOS positioned on a substrate;
 an NMOS positioned on the substrate;
 a buffering stress film positioned on the PMOS, wherein the buffering stress film has a first compressive stress ranging from about −0.1 Gpa to −3.2 Gpa;
 a compressive stress film directly positioned on the buffering stress film, wherein the compressive stress film has a second compressive stress higher than the first compressive stress of the buffering stress film;
 a tensile stress film positioned on the NMOS; and
 a first protective layer continuously covering the entire PMOS and continuously covering the entire NMOS, wherein the first protective layer is below the tensile stress film and the buffering stress film.

2. The strained-silicon transistor structure of claim 1, further comprising a second protective layer on the tensile stress film.

3. The strained-silicon transistor structure of claim 1, wherein the first compressive stress of the buffering stress film is between −2.0 Gpa to −3.0 Gpa.

4. The strained-silicon transistor structure of claim 1, wherein the thickness of the buffering stress film is between 1 angstrom to 200 angstroms.

5. The strained-silicon transistor structure of claim 4, wherein the thickness of the buffering stress film is between 20 angstrom to 50 angstroms.

6. The strained-silicon transistor structure of claim 1, wherein the buffering stress film and the compressive stress film are made of the same material.

7. The strained-silicon transistor structure of claim 1, wherein the thickness of the buffering stress film is smaller than the thickness of the compressive film.

* * * * *